(12) United States Patent
Wakiyama et al.

(10) Patent No.: US 11,476,291 B2
(45) Date of Patent: Oct. 18, 2022

(54) SEMICONDUCTOR DEVICE AND METHOD OF MANUFACTURING THEREOF

(71) Applicant: SONY CORPORATION, Tokyo (JP)

(72) Inventors: Satoru Wakiyama, Kanagawa (JP); Naoki Jyo, Kanagawa (JP); Kan Shimizu, Tokyo (JP); Toshihiko Hayashi, Kanagawa (JP); Takuya Nakamura, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/503,062

(22) Filed: Jul. 3, 2019

(65) Prior Publication Data

US 2019/0326344 A1    Oct. 24, 2019

Related U.S. Application Data

(63) Continuation of application No. 15/118,575, filed as application No. PCT/JP2015/002071 on Apr. 15, 2015, now Pat. No. 10,600,838.

(30) Foreign Application Priority Data

Apr. 23, 2014  (JP) ................ 2014-088804
Dec. 18, 2014  (JP) ................ 2014-256186

(51) Int. Cl.
   *H01L 23/31*       (2006.01)
   *H01L 27/146*      (2006.01)
   (Continued)

(52) U.S. Cl.
   CPC .... *H01L 27/14634* (2013.01); *H01L 23/3192* (2013.01); *H01L 23/481* (2013.01);
   (Continued)

(58) Field of Classification Search
   CPC ......... H01L 24/12–14; H01L 24/04–06; H01L 2224/05681; H01L 2224/13172;
   (Continued)

(56) References Cited

U.S. PATENT DOCUMENTS 4,617,730 A  * 10/1986  Geldermans .......... H01L 21/486
                                                        174/258
6,092,714 A     7/2000  Casey
   (Continued)

FOREIGN PATENT DOCUMENTS

CN       1770437      5/2006
CN     101969063      2/2011
   (Continued)

OTHER PUBLICATIONS

Official Action (with English translation) for Chinese Patent Application No. 201811352193.1, dated Jul. 11, 2019, 17 pages.
   (Continued)

*Primary Examiner* — Eric A. Ward
(74) *Attorney, Agent, or Firm* — Sheridan Ross P.C.

(57) ABSTRACT

There is provided semiconductor devices and methods of forming the same, the semiconductor devices including: a first semiconductor element having a first electrode; a second semiconductor element having a second electrode; a Sn-based micro-solder bump formed on the second electrode; and a concave bump pad including the first electrode opposite to the micro-solder bump, where the first electrode is connected to the second electrode via the micro-solder bump and the concave bump pad.

26 Claims, 19 Drawing Sheets

(51) Int. Cl.
*H01L 23/00* (2006.01)
*H01L 23/48* (2006.01)

(52) U.S. Cl.
CPC .............. *H01L 24/03* (2013.01); *H01L 24/05* (2013.01); *H01L 24/06* (2013.01); *H01L 24/11* (2013.01); *H01L 24/13* (2013.01); *H01L 24/14* (2013.01); *H01L 24/16* (2013.01); *H01L 24/81* (2013.01); *H01L 27/1469* (2013.01); *H01L 27/14636* (2013.01); *H01L 27/14643* (2013.01); *H01L 2224/0345* (2013.01); *H01L 2224/0346* (2013.01); *H01L 2224/0391* (2013.01); *H01L 2224/03616* (2013.01); *H01L 2224/0401* (2013.01); *H01L 2224/05005* (2013.01); *H01L 2224/0508* (2013.01); *H01L 2224/05008* (2013.01); *H01L 2224/05009* (2013.01); *H01L 2224/05017* (2013.01); *H01L 2224/05022* (2013.01); *H01L 2224/05026* (2013.01); *H01L 2224/05083* (2013.01); *H01L 2224/05124* (2013.01); *H01L 2224/05144* (2013.01); *H01L 2224/05147* (2013.01); *H01L 2224/05155* (2013.01); *H01L 2224/05157* (2013.01); *H01L 2224/05164* (2013.01); *H01L 2224/05166* (2013.01); *H01L 2224/05169* (2013.01); *H01L 2224/05172* (2013.01); *H01L 2224/05181* (2013.01); *H01L 2224/05186* (2013.01); *H01L 2224/05541* (2013.01); *H01L 2224/05547* (2013.01); *H01L 2224/05567* (2013.01); *H01L 2224/05573* (2013.01); *H01L 2224/05644* (2013.01); *H01L 2224/05647* (2013.01); *H01L 2224/05655* (2013.01); *H01L 2224/05657* (2013.01); *H01L 2224/05664* (2013.01); *H01L 2224/05669* (2013.01); *H01L 2224/0603* (2013.01); *H01L 2224/13006* (2013.01); *H01L 2224/13025* (2013.01); *H01L 2224/13111* (2013.01); *H01L 2224/1403* (2013.01); *H01L 2224/16145* (2013.01); *H01L 2224/16147* (2013.01); *H01L 2224/16237* (2013.01); *H01L 2224/16501* (2013.01); *H01L 2224/73204* (2013.01); *H01L 2224/73257* (2013.01); *H01L 2224/81065* (2013.01); *H01L 2224/81097* (2013.01); *H01L 2224/81191* (2013.01); *H01L 2224/81948* (2013.01); *H01L 2924/04953* (2013.01); *H01L 2924/12043* (2013.01)

(58) Field of Classification Search
CPC . H01L 2224/13179; H01L 2224/13181; H01L 21/486; H01L 21/49827; H01L 27/14634; H01L 27/14636; H01L 24/05; H01L 24/06; H01L 2224/0401; H01L 2224/05181; H01L 2924/01073; H01L 2924/01023; H01L 2924/04953
See application file for complete search history.

(56) References Cited

U.S. PATENT DOCUMENTS

| | | | | |
|---|---|---|---|---|
| 6,218,302 | B1* | 4/2001 | Braeckelmann | ........................... H01L 21/76807 438/687 |
| 6,417,575 | B2* | 7/2002 | Harada | ................... H01L 24/11 257/784 |
| 6,815,324 | B2 | 11/2004 | Huang et al. | |
| 6,878,633 | B2* | 4/2005 | Raskin | ................... H01L 23/645 257/E21.508 |
| 7,388,289 | B1* | 6/2008 | Rhodes | ................... H01L 24/03 257/751 |
| 7,427,557 | B2* | 9/2008 | Rinne | ................... H05K 3/243 438/612 |
| 7,741,714 | B2* | 6/2010 | Huang | ................... H01L 24/05 257/754 |
| 8,227,295 | B2 | 7/2012 | Simmons-Matthews et al. | |
| 8,581,418 | B2* | 11/2013 | Wu | ....................... H01L 21/6835 257/686 |
| 9,018,758 | B2 | 4/2015 | Hwang et al. | |
| 10,600,838 | B2 | 3/2020 | Wakiyama et al. | |
| 2003/0080428 | A1* | 5/2003 | Izumitani | ............. H01L 23/5226 257/758 |
| 2006/0289991 | A1* | 12/2006 | Morita | ..................... H01L 24/11 257/737 |
| 2006/0292824 | A1* | 12/2006 | Beyne | ................. B81C 1/00333 438/455 |
| 2008/0230903 | A1* | 9/2008 | Sato | ........................ H01L 23/60 257/738 |
| 2009/0243098 | A1* | 10/2009 | Farooq | ..................... H01L 24/11 257/738 |
| 2012/0217607 | A1 | 8/2012 | Hanai et al. | |
| 2012/0292728 | A1* | 11/2012 | Tsai | .................... H01L 27/1464 257/435 |
| 2013/0001783 | A1 | 1/2013 | Yu et al. | |
| 2013/0049216 | A1 | 2/2013 | Lin et al. | |
| 2013/0069190 | A1 | 3/2013 | Kao et al. | |
| 2013/0234318 | A1 | 9/2013 | Lee et al. | |
| 2013/0285180 | A1 | 10/2013 | Wang et al. | |
| 2014/0061842 | A1* | 3/2014 | Ting | .................. H01L 27/14687 257/E31.124 |
| 2015/0115440 | A1* | 4/2015 | Higuchi | ................... H01L 24/05 257/737 |
| 2015/0221682 | A1* | 8/2015 | Voutsas | ................ H01L 27/1255 257/71 |
| 2018/0308891 | A1 | 10/2018 | Wakiyama et al. | |

FOREIGN PATENT DOCUMENTS

| | | |
|---|---|---|
| CN | 103633059 | 3/2014 |
| JP | H06-232209 | 8/1994 |
| JP | 2000-243904 | 9/2000 |
| JP | 2001015549 A | 1/2001 |
| JP | 2005-515628 | 5/2005 |
| JP | 2006-108604 | 4/2006 |
| JP | 2006-129762 | 1/2009 |
| JP | 2009252997 A | 10/2009 |
| JP | 2012-059738 | 3/2012 |
| JP | 2013110338 A | 6/2013 |
| WO | WO-2013161891 A1 | 10/2013 |
| WO | WO-2014033977 A1 | 3/2014 |

OTHER PUBLICATIONS

Official Action (no English translation available) for Japanese Patent Application No. 2018-198181, dated Aug. 6, 2019, 6 pages.
International Search Report for international (PCT) Patent Application No. PCT/JP2015/002071, dated Jul. 15, 2015, 12 pages.
Official Action (no English translation available) for Japanese Patent Application No. 2014-256186, dated Mar. 6, 2018, 6 pages.
Official Action (with English translation) for Chinese Patent application No. 201580006909.0, dated Jun. 5, 2018, 20 pages.
Official Action for U.S. Appl. No. 15/118,575, dated Sep. 22, 2017, 15 pages.
Official Action for U.S. Appl. No. 15/118,575, dated Feb. 21, 2018, 18 pages.
Official Action for U.S. Appl. No. 15/118,575, dated Jun. 15, 2018, 17 pages.
Official Action for U.S. Appl. No. 15/118,575, dated Jan. 25, 2019, 15 pages.
Official Action for U.S. Appl. No. 15/118,575, dated Jul. 11, 2019, 12 pages.

(56) References Cited

OTHER PUBLICATIONS

Notice of Allowance for U.S. Appl. No. 15/118,575, dated Oct. 28, 2019, 9 pages.

* cited by examiner

FIG. 9

| | FIRST METAL | | SECOND METAL | | THIRD METAL | | EVALUATION RESULT | | REMARKS |
|---|---|---|---|---|---|---|---|---|---|
| | TYPE OF FILM | THICKNESS (nm) | TYPE OF FILM | THICKNESS (nm) | TYPE OF FILM | THICKNESS (nm) | CONNECTIVITY | HIGH TEMPERATURE EXPOSURE TEST | |
| EXAMPLE 1 | TaN | 15 | Ta | 100 | Cu | 80 | ○ | ○ | |
| EXAMPLE 2 | TaN | 15 | Ta | 100 | Co | 110 | ○ | ○ | CHANGE TYPE OF THIRD METAL |
| EXAMPLE 3 | TaN | 15 | Ta | 100 | Cu | 360 | ○ | ○ | CHANGE THICKNESS OF Cu |
| EXAMPLE 4 | TaN | 15 | Ta | 50 | Cu | 80 | ○ | ○ | CHANGE THICKNESS OF Ta |
| EXAMPLE 5 | TaN | 15 | Ta | 30 | Cu | 80 | ○ | ○ | CHANGE THICKNESS OF Ta |
| COMPARATIVE EXAMPLE 1 | – | – | – | – | Cu | 250 | ○ | × | |

SEMICONDUCTOR DEVICE AND METHOD OF MANUFACTURING THEREOF

CROSS REFERENCE TO RELATED APPLICATION

This application is a continuation of U.S. patent application Ser. No. 15/118,575, filed Aug. 12, 2016, which is a national stage application under U.S.C. 371 and claims the benefit of PCT Application No. PCT/JP2015/002071 having an international filing date of 15 Aug. 2015, which designed the United States, which PCT application claimed the benefit of Japanese Patent Application No. 2014-088804 filed 23 Apr. 2014, and Japanese Patent Application No. 2014-256186 filed 18 Dec. 2014, the disclosures of which are incorporated herein by reference in their entirety.

TECHNICAL FIELD

The present disclosure relates to a semiconductor device and a method of manufacturing thereof, particularly, a semiconductor device in which the respective electrodes of stacked semiconductor elements are electrically connected to each other via Sn-based soldering, and a method of manufacturing thereof.

BACKGROUND ART

In the related art, in processes of manufacturing a semiconductor device that is configured via the stacking of semiconductor elements, a technique of forming Sn-based (SnAg or the like) micro-solder bumps is used so as to connect the respective electrodes of the stacked semiconductor elements.

FIG. 1 is a view schematically illustrating a technique of forming Sn-based micro-solder bumps that are used so as to stack semiconductor elements in the related art.

As illustrated in FIG. 1, a portion of an Al PAD 2 on a first semiconductor element, that is, one semiconductor element, is exposed, and Ni or the like is formed as a barrier metal 3 thereon. A Sn-based micro-solder bump 6 is formed on a second semi-conductor element 4, that is, the other semi-conductor element, and the barrier metal 3 and the Sn-based micro-solder bump 6 are diffusion connected to each other via formic acid reduction.

FIG. 2 is a graph illustrating the theoretical diffusion distance (at 200 degrees Celsius) of each of various metals vs. time, the metals being obtainable from Sn and barrier metals. As is apparent from FIG. 2, in a case where the diffusion connection is made via the above-mentioned formic acid reduction, it is necessary to form the barrier metal 3 having a thickness on the order of a micrometer, specifically, a thickness of 3 micrometers or greater, when taking into consideration the diffusivity of a Sn-based solder.

However, it is difficult to fluidize the barrier metal 3 having a thickness on the order of a micrometer in a wafer process among the processes of manufacturing the semiconductor device.

In a case disclosed in PTL 1, Ti is adopted as a barrier metal for a Sn-based solder, and Ti having a thickness of approximately 200 nanometers, which can be fluidized in a wafer process, is formed using a sputtering technique as a die bond technology.

CITATION LIST

Patent Literature

PTL 1: Japanese Unexamined Patent Application Publication No. 2006-108604

SUMMARY OF INVENTION

Technical Problem

However, in the method disclosed in PTL 1, when semiconductor elements were merely physically connected to each other via the die bond technology, and were subjected to a high temperature exposure test which was performed by the applicant, the resistance of the boundary between the Sn-based solder and Ti increased due to alloy growth, oxidation, or the like. Accordingly, according to the method disclosed in PTL 1, the respective electrodes of stacked semiconductor elements can be physically connected to each other; however, the respective electrodes of stacked semiconductor elements may not be electrically connected to each other.

The present disclosure is made in light of this problem, and according to the present disclosure, it is possible to electrically connect the respective electrodes of stacked semiconductor elements.

Solution to Problem

According to an embodiment of the present disclosure, there is provided a semi-conductor device including a first semiconductor element having a first electrode; a second semiconductor element having a second electrode; a Sn-based micro-solder bump formed on the second electrode; and a concave bump pad formed on the first electrode opposite to the micro-solder bump, where the first electrode is connected to the second electrode via the micro-solder bump and the concave bump pad.

A third metal layer diffused to the micro-bump and close to the micro-bump, and a second metal layer made of a metal of the vanadium group may be sequentially formed on the bump pad.

The first semiconductor element may have a plurality of bump pads thereon, the diameters of which are different from each other.

The diameters of the bump pads may be different depending on the use of the respective electrodes connected thereto.

The diameter of the micro-bump of the second semiconductor element may correspond to that of the bump pad of the corresponding first semiconductor element.

The third metal layer close to the micro-bump, the second metal layer, and a first metal layer may be sequentially formed on the bump pad, the first metal layer being formed of a nitride film of the metal of the vanadium group used in the second metal layer.

The second metal layer may have an average thickness of 30 nanometers or greater.

The first metal layer may have an average thickness of 10 nanometers or greater.

The second metal layer may be made of Ta, and the first metal layer is made of TaN.

The third metal layer may be made of Cu, Co, Ni, Pd, Au, or Pt.

The bump pad may be formed by an opening portion that is provided from the surface of the first semiconductor element to a through-electrode in the first semi-conductor element.

The bump pad may be formed by an opening portion that is provided from the surface of the first semiconductor element to a metal wiring in the first semiconductor element.

The semiconductor device may be a stacked CMOS image sensor in which a logic chip equivalent to the second semiconductor element is CoW-connected to a pixel substrate equivalent to the first semiconductor element.

According to a second embodiment of the present disclosure, there is provided a method of manufacturing a semiconductor device that includes a first semiconductor element having a first electrode stacked with a second semiconductor element having a second electrode, the method including: forming a Sn-based micro-solder bump on the second electrode; and forming a concave bump pad on the first electrode opposite to the micro-solder bump, where the first electrode is connected to the second electrode via the micro-solder bump and the concave bump pad.

In the forming of the bump pad, a second metal layer made of a metal of the vanadium group may be formed on the electrode of the first semiconductor element that is the other of the opposite semiconductor elements, the electrode being connected to the electrode of the second semiconductor element via the micro-bump, and a third metal layer may be formed on the second metal layer, which is diffused to the micro-bump, and the micro-bump may be brought into contact with the third metal layer, and the micro-bump and the third metal layer may be subjected to a heating treatment associated with a reducing atmosphere, and thereby the third metal layer and an oxide film on the surface of the micro-bump may be reduced, and due to the diffusion of the third metal layer to the micro-bump, the micro-bump and the second metal layer may be brought into contact with each other, and the respective electrodes of the first semi-conductor element and the second semiconductor element may be electrically connected to each other.

In the forming of the bump pad, a passivation layer may be formed on the third metal layer of the first semiconductor element, and an opening portion may be provided via the etching of the passivation layer in order for the third metal layer to be exposed.

In the forming of the bump pad, before the second metal layer is formed, a first metal layer may be formed on the electrode of the first semiconductor element that is the other of the opposite semiconductor elements, the electrode being connected to the second semiconductor element via the micro-bump, and the first metal layer may be formed of a nitride film of the metal of the vanadium group used in the second metal layer.

In the forming of the bump pad, the bump pad may be formed by providing an opening portion from a surface of the first semiconductor element to a through-electrode in the first semiconductor element.

In the forming of the bump pad, the bump pad may be formed by providing an opening portion from a surface of the first semiconductor element to a metal wiring in the first semiconductor element.

Advantageous Effects of Invention

According to the first embodiment of the present disclosure, it is possible to obtain the semiconductor device in which the respective electrodes of the first semiconductor element and the second semiconductor element are electrically connected to each other.

According to the second embodiment of the present disclosure, it is possible to manufacture the semiconductor device in which the respective electrodes of the first semiconductor element and the second semiconductor element are electrically connected to each other.

BRIEF DESCRIPTION OF DRAWINGS

FIG. 9 is a table illustrating examples of the material and the thickness of each of first to third metal layers.

DESCRIPTION OF EMBODIMENTS

Hereinafter, the most preferable form (hereinafter, referred to as an embodiment) for realizing the present disclosure will be described in detail with reference to the accompanying drawings.

<Example of Configuration of Semiconductor Device>

Figure 1:
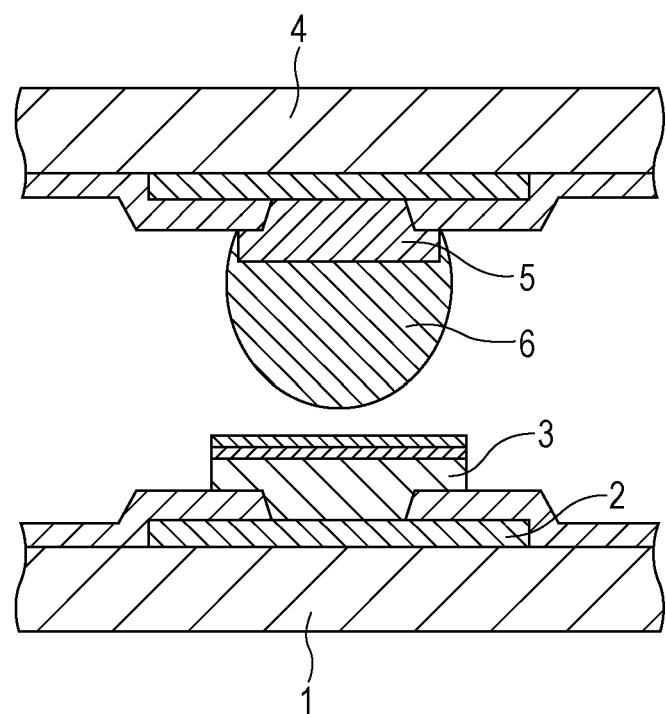
FIG. 1 is a view schematically illustrating a technique of using Sn-based micro-solder bumps so as to connect the respective electrodes of stacked semiconductor elements.
Figure 2:
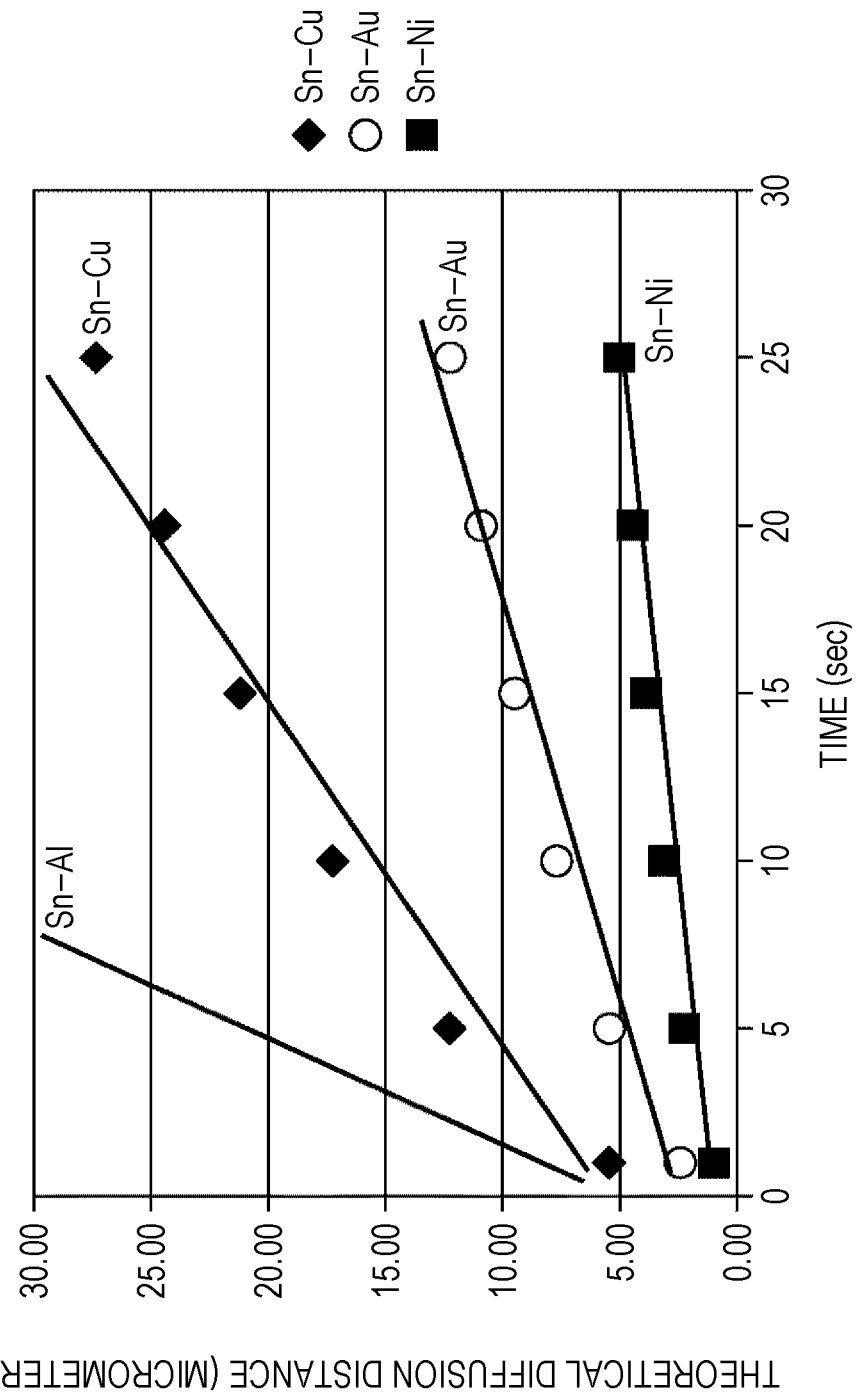
FIG. 2 is a graph illustrating the theoretical diffusion distance of each of various metals vs. time, the metals being obtainable from Sn and barrier metals.
Figure 3:
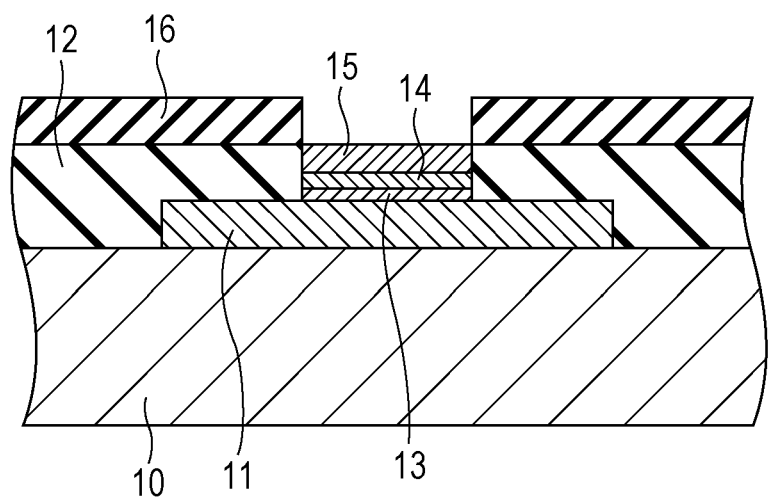
FIG. 3 is a cross-sectional view illustrating an example of the configuration of a semiconductor device to which the present disclosure is applied.

FIG. 3 is a cross-sectional view illustrating an example of the configuration of a semi-conductor device that is an embodiment of the present disclosure. FIG. 3 illustrates only a first semiconductor element on which a micro-bump is not formed out of the first semiconductor element and a second semiconductor element which are stacked on each other and are electrically connected to each other via a Sn-based solder.

A Sn-based solder material may be a SnAg-based, SnBi-based, SnCu-based, SnIn-based, or SnAgCu-based solder material, or the like.

As illustrated in FIG. 3, an Al PAD 11 is provided as an electrode on a first semi-conductor element 10, a part of the Al PAD 11 becomes an opening portion 21 (refer to FIGS. 5A to 5E) for connecting the first semiconductor element 10 and a micro-bump of the second semiconductor element, and a first metal layer 13, a second metal layer 14, and a third metal layer 15 are sequentially formed on the opening portion 21. $SiO_2$ layers 12 are formed on portions other than the opening portion 21, and a SiN layer 16 is formed on the $SiO_2$ layer.

The first metal layer 13 acting as a barrier metal is formed of a nitride film of the metal used in the second metal layer 14. For example, TaN is used in the example illustrated in FIG. 3. The first metal layer 13 has an average thickness of approximately 10 nanometers or greater. Accordingly, particularly, it is possible to form the first metal layer 13 in the wafer process by which it is possible to decrease particle risk.

Since the first metal layer (barrier metal) 13 is provided, it is possible to prevent reaction between the Al PAD 11 and the second metal layer 14, and between the Al PAD 11 and an alloy layer that can be formed due to reaction between the Sn-based micro-solder bump of the second semiconductor element and the second metal layer 14. Accordingly, it is possible to anticipate improvement in the reliability and the electric characteristics of the semiconductor device. The first metal layer 13 may not be provided.

For example, Ta is used in the second metal layer 14, and has a correlation and low diffusivity with respect to the Sn-based solder. The second metal layer 14 has an average thickness of approximately 30 nanometers or greater. Accordingly, particularly, it is possible to form the second metal layer 14 in the wafer process by which it is possible to decrease particle risk. Metals (V, Nb, and the like) of the vanadium group other than Ta can be used in the second metal layer 14, which have low diffusivity with respect to the Sn-based solder.

For example, Cu is used in the third metal layer 15, which has high diffusivity with respect to Sn, and an oxide surface film of the second metal layer 14 can be reduced using a no-clean flux, reduction gas, or the like. An average thickness of the third metal layer 15 is set to be approximately 80 nanometers or greater so as to prevent the oxidation of the second metal layer 14. It is possible to use Co, Ni, Pd, Au, Pt, or the like other than Cu in the third metal layer 15.

Since the above-mentioned configuration is adopted, even when Ta, Ti, or the like is used as the material of the second metal layer 14, which is considerably likely to oxidize and is unlikely to be reduced, it is possible to easily bring the Sn-based solder and the second metal layer 14 into contact (reaction) with each other. Since Ta is used in the second metal layer 14, it is possible to improve the reliability and the electric characteristics of the semiconductor device.

<Manufacturing Method by Which Manufacturing Apparatus Manufactures Semi-Conductor Device>

Subsequently, a method of manufacturing the semiconductor device illustrated in FIG. 3 will be described with reference to FIGS. 4 to 6C.

Figure 4:
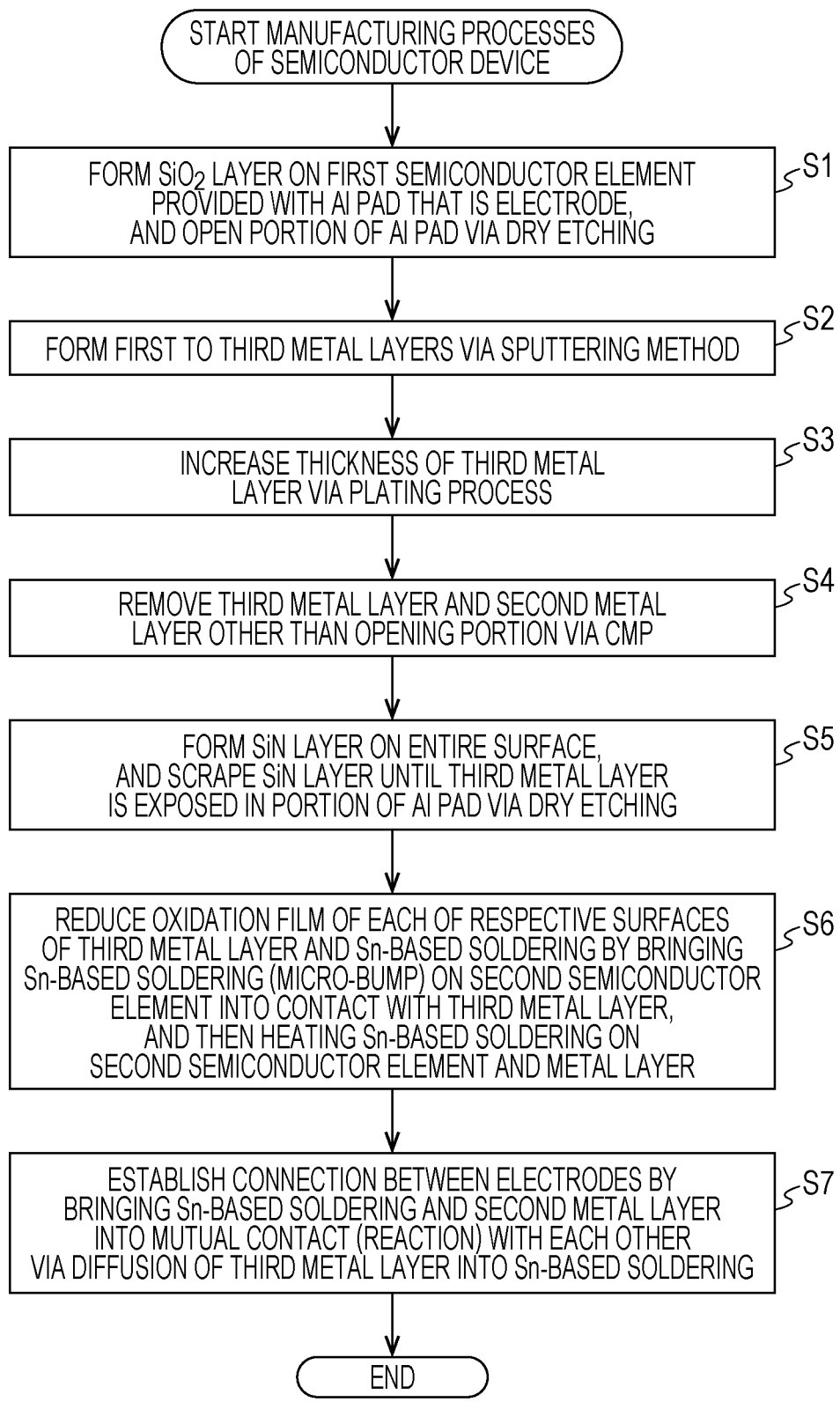
FIG. 4 is a flowchart illustrating a method of manufacturing the semiconductor device illustrated in FIG. 3.

FIG. 4 is a flowchart illustrating the method of manufacturing the semiconductor device illustrated in FIG. 3. FIGS. 5A to 6C are cross-sectional views of the semi-conductor device illustrating the processes of manufacturing thereof.

Figure 5A:
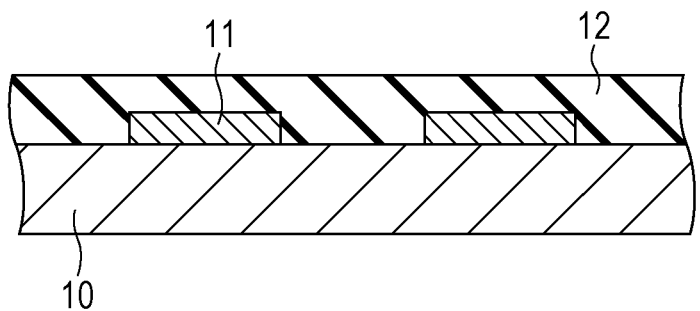
FIG. 5A is a cross-sectional view of the semiconductor device illustrating the process of manufacturing thereof.
Figure 5B:
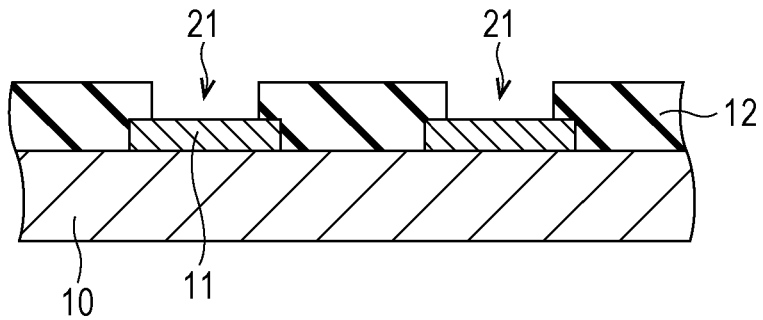
FIG. 5B is a cross-sectional view of the semiconductor device illustrating the process of manufacturing thereof.

As illustrated in FIG. 5A, in step S1, the $SiO_2$ layer 12 is formed on the first semi-conductor element 10 on which the Al PAD 11 is provided as an electrode. Subsequently, resist patterning (not illustrated) for protecting the portions other than the opening portion 21 is applied to the surface of the $SiO_2$ layer 12, depending on the position and the diameter of the opening portion 21 that will be described later. In addition, as illustrated in FIG. 5B, the opening portion 21 is provided by scraping the $SiO_2$ layer 12 via dry etching until the Al PAD 11 is exposed.

Figure 5C:
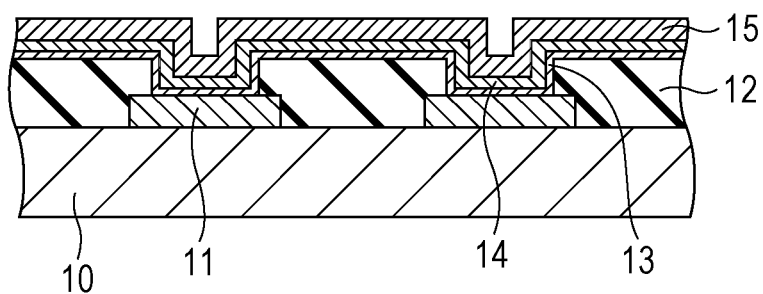
FIG. 5C is a cross-sectional view of the semiconductor device illustrating the process of manufacturing thereof.
Figure 5D:
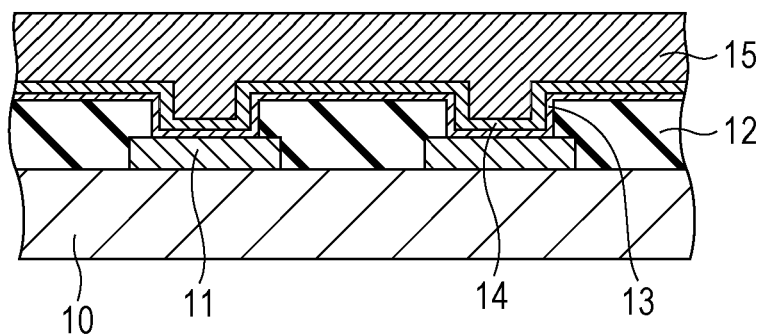
FIG. 5D is a cross-sectional view of the semiconductor device illustrating the process of manufacturing thereof.

As illustrated in FIG. 5C, in step S2, the first metal layer (TaN) 13, the second metal layer (Ta) 14, and the third metal layer (Cu) 15 are formed via a sputtering method. Subsequently, as illustrated in FIG. 5D, in step S3, the third metal layer 15 is subjected to a plating process using the same material (Cu in this case) as that of the third metal layer 15, and thereby the third metal layer 15 increases in thickness, and the concavity of the opening portion 21 is plugged with the third metal layer 15.

Figure 5E:
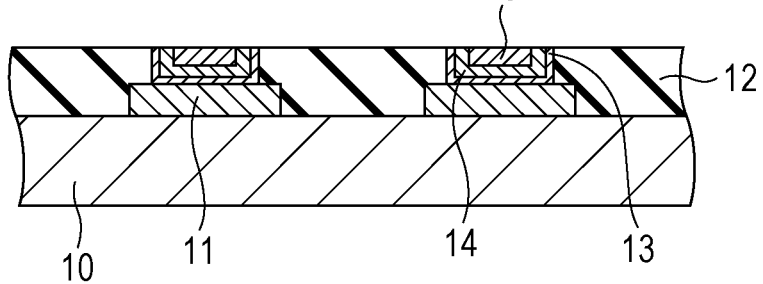
FIG. 5E is a cross-sectional view of the semiconductor device illustrating the process of manufacturing thereof.
Figure 6A:
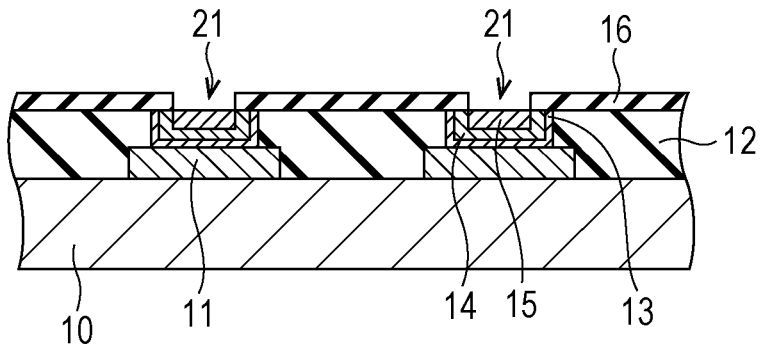
FIG. 6A is a cross-sectional view of the semiconductor device illustrating the process of manufacturing thereof.

As illustrated in FIG. 5E, in step S4, the third metal layer 15 and the second metal layer 14 other than the opening portion 21 are removed via chemical mechanical polishing (CMP). In step S5, a SiN layer 16 is formed as a passivation layer on the entire surface, and resist patterning (not illustrated) is applied to the surface of the SiN layer 16. In addition, as illustrated in FIG. 6A, the SiN layer 16 is scraped via dry etching until the third metal layer 15 of the opening portion 21 is exposed. Accordingly, the opening portion 21 has a concave structure, and thereby it is easy to align the position of the opening portion 21 with the position of a Sn-based micro-solder bump 24 that is formed on the second semiconductor element 23. Hereinafter, the opening portion 21 opposite to the micro-bump 24 is also referred to as a bump pad 21.

Figure 6B:
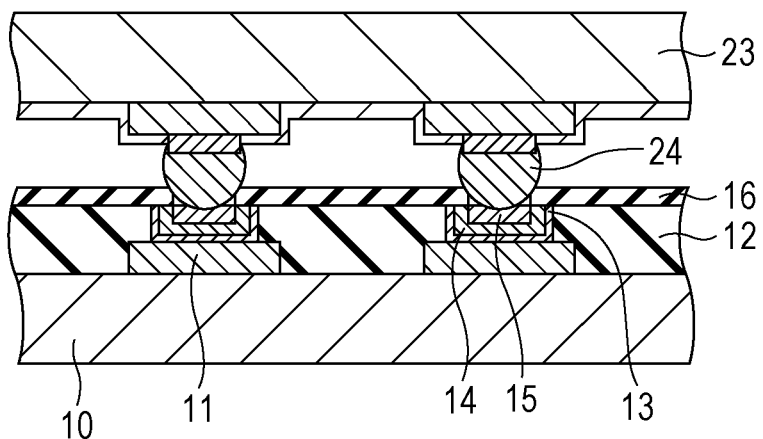
FIG. 6B is a cross-sectional view of the semiconductor device illustrating the process of manufacturing thereof.
Figure 6C:
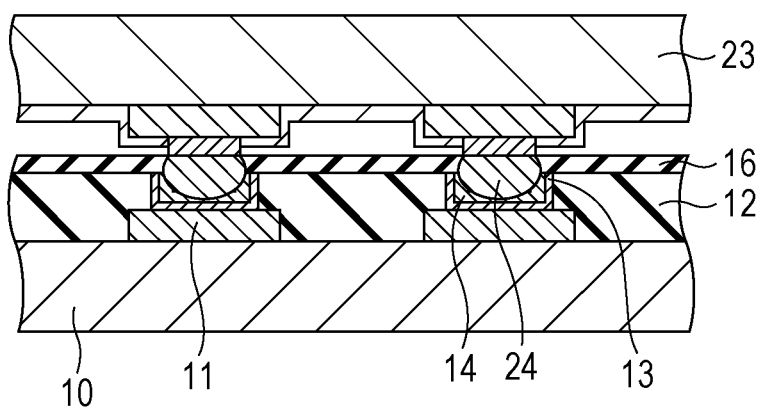
FIG. 6C is a cross-sectional view of the semiconductor device illustrating the process of manufacturing thereof.

As illustrated in FIG. 6B, in step S6, the micro-bump 24 on the second semiconductor element 23 and the third metal layer 15 of the bump pad 21 are brought into contact with each other, and are subjected to a heating treatment associated with a reducing atmosphere such as a formic acid atmosphere, and thereby the third metal layer 15 and an oxide film on the surface of the Sn-based micro-solder bump 24 are reduced. As illustrated in FIG. 6C, thereafter, in step S7, the third metal layer 15 is diffused to the Sn-based solder, and thereby the Sn-based solder and the second metal layer 14 are brought into contact (reaction) with each other, and connection is established between the electrode of the second semiconductor element 23 and the Al PAD 11 that is the electrode of the first semiconductor element 10. The manufacturing method up to now is described.

<Correlation Diagram Between Second Metal Layer 14 and Micro-Bump 24>

Figure 7:
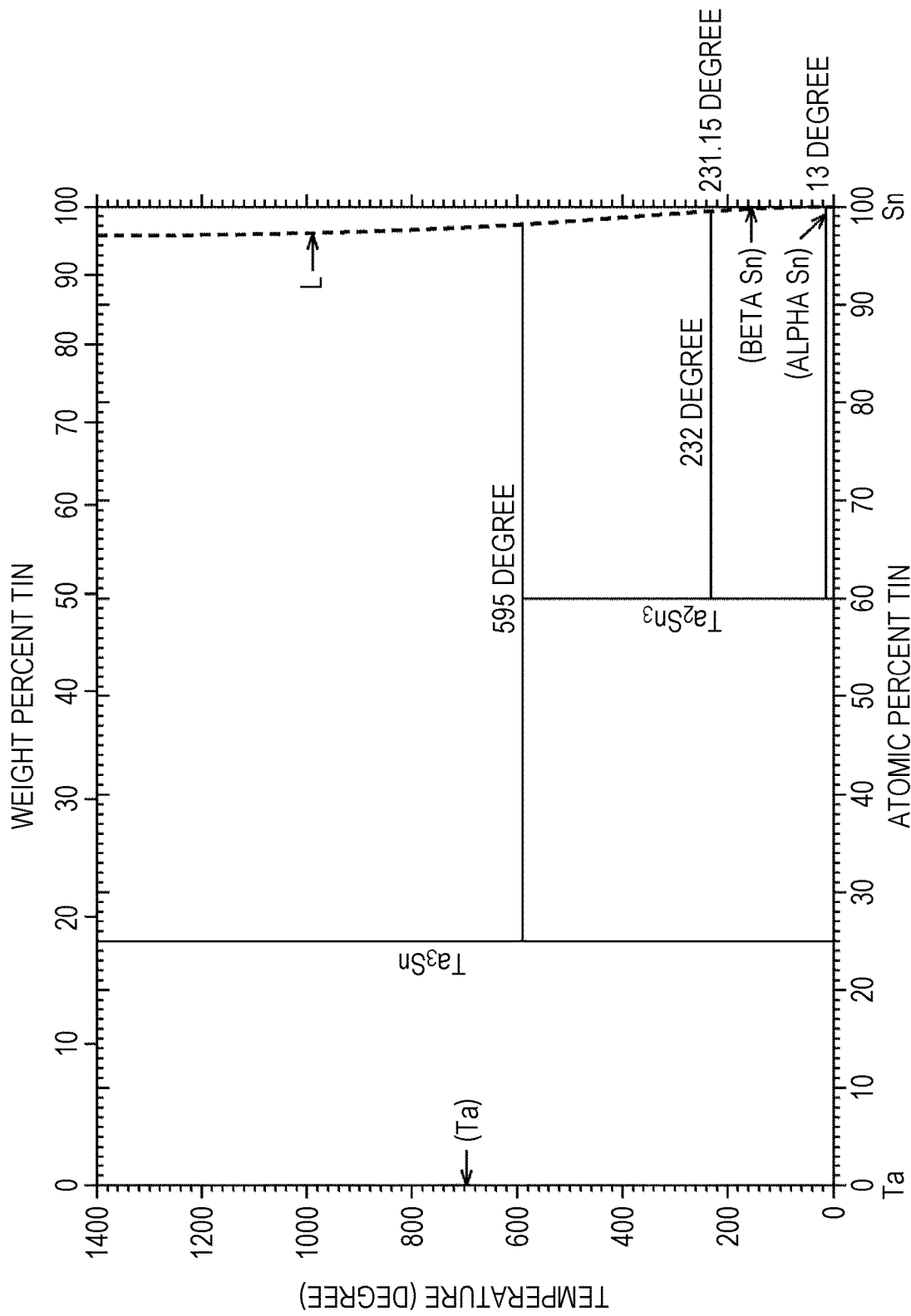
FIG. 7 is a correlation diagram between Sn and Ta.

FIG. 7 is a correlation diagram between Ta used in the second metal layer 14 and Sn contained in the Sn-based micro-solder bump 24. As illustrated in FIG. 7, when bump connection is established at a temperature of 250 degrees Celsius, it is inferred that an alloy of $Ta_3Sn$ or an alloy of $Ta_2Sn_3$ is formed at the boundaries between Ta and Sn.

<Measurement Results of Kelvin Resistance vs High Temperature Exposure Time>

Figure 8:
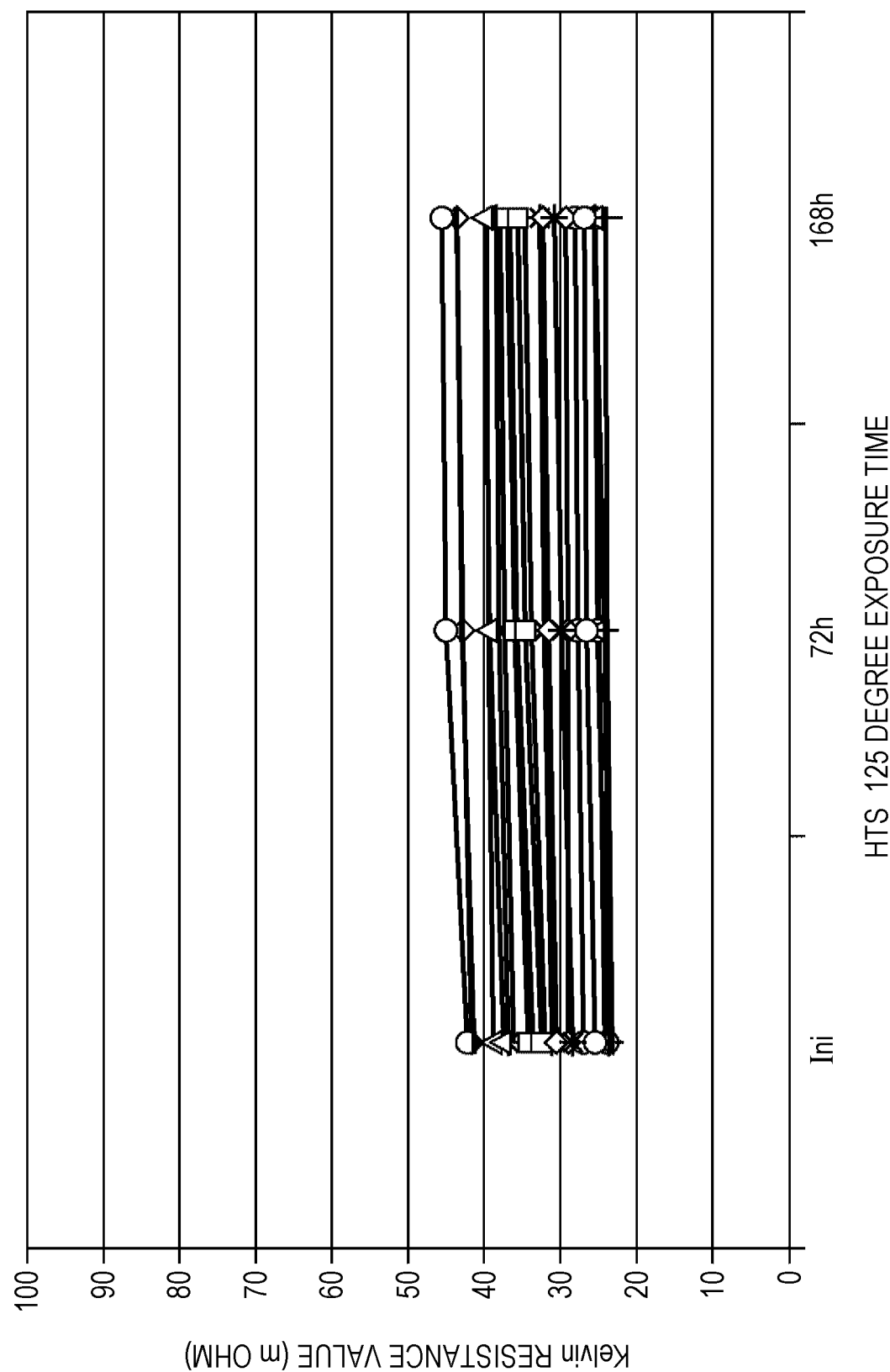
FIG. 8 is a graph illustrating changes in resistance values from an exposure test at 125 degrees Celsius.

FIG. 8 is a graph illustrating measurement results of Kelvin resistance vs. high temperature exposure time at 125 degrees Celsius when TaN, Ta, and Cu are respectively used in the first metal layer 13, the second metal layer 14, and the third metal layer 15, and the second metal layer 14 is connected to the Sn-based micro-solder bump 24. As illustrated in FIG. 8, resistance values did not change even after 168 hours had elapsed. Accordingly, it is understood that the electric connection between the respective electrodes of the first semiconductor element 10 and the second semiconductor element 23 is maintained even after time has elapsed.

<Regarding Material and Thickness of First Metal Layer 13, Second Metal Layer 14, and Third Metal Layer 15>

Subsequently, FIG. 9 is a table illustrating the evaluation of first to fifth examples and a comparative example (the configuration disclosed in PTL 1) when the thickness of the second metal layer 14 and the material and the thickness of the third metal layer 15 are changed.

In the first example, TaN, Ta, and Cu are respectively used in the first metal layer 13 having a thickness of 15 nanometers, the second metal layer 14 having a thickness of 100 nanometers, and the third metal layer 15 having a thickness of 80 nanometers. In the second example, TaN, Ta, and Cu are respectively used in the first metal layer 13 having a thickness of 15 nanometers, the second metal layer 14 having a thickness of 100 nanometers, and the third metal layer 15 having a thickness of 100 nanometers. In the third example, TaN, Ta, and Cu are respectively used in the first metal layer 13 having a thickness of 15 nanometers, the second metal layer 14 having a thickness of 100 nanometers, and the third metal layer 15 having a thickness of 360 nanometers. In the fourth example, TaN, Ta, and Cu are respectively used in the first metal layer 13 having a thickness of 15 nanometers, the second metal layer 14 having a thickness of 50 nanometers, and the third metal layer 15 having a thickness of 80 nanometers. In the fifth example, TaN, Ta, and Cu are respectively used in the first metal layer 13 having a thickness of 15 nanometers, the second metal layer 14 having a thickness of 30 nanometers, and the third metal layer 15 having a thickness of 80 nanometers. In any one of the first to fifth examples, there was no problem with the connectivity between the metal layers and the results of high temperature exposure tests, and physical connection and electric connection were established between the respective electrodes of the first semiconductor element 10 and the second semiconductor element 23. In the comparative example, physical connection was established between the electrodes; however, a resistance value increased over time, and electric connection was not maintained therebetween.

<First Modification Example of Semiconductor Device>

Figure 10:
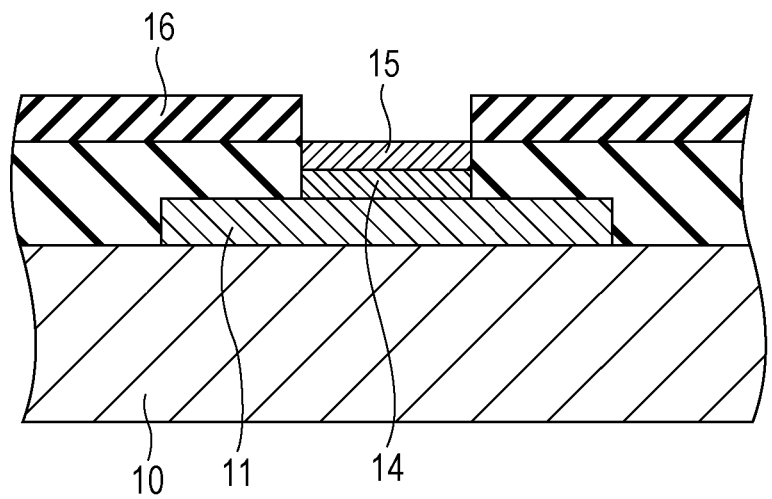
FIG. 10 is a cross-sectional view illustrating a first modification example of the semiconductor device to which the present disclosure is applied.

FIG. 10 is a cross-sectional view illustrating a first modification example of the semi-conductor device according to the embodiment of the present disclosure. The first modification example has a configuration in which the first metal layer 13 is omitted from the configuration illustrated in FIG. 3. Accordingly, it is possible to decrease a process takt time and costs.

<Second Modification Example of Semiconductor Example>

Figure 11:
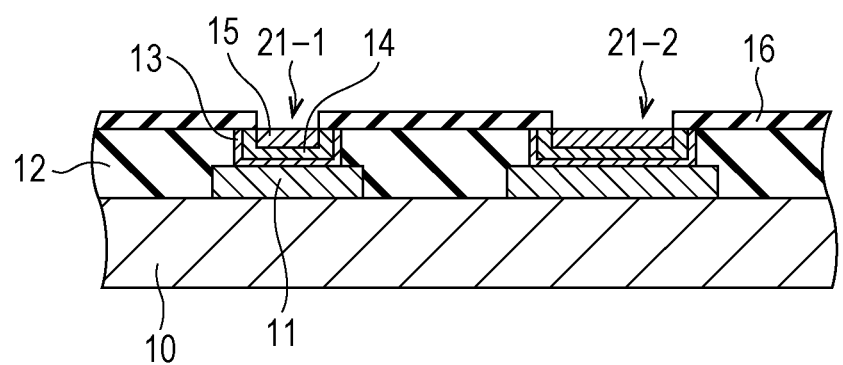
FIG. 11 is a cross-sectional view illustrating a second modification example of the semiconductor device to which the present disclosure is applied.

Subsequently, FIG. 11 is a cross-sectional view illustrating a second modification example of the semiconductor device according to the embodiment of the present disclosure.

In the configuration of the second modification example, the diameter of the bump pad 21 on the first semiconductor element 10 is changed depending on the use of an electrode (electric line) connected to the bump pad 21. Two bump pads 21 are provided on the first semiconductor element 10, and a bump pad 21-2 is formed to have a diameter greater than that of a bump pad 21-1.

It is possible to easily change the diameters of a plurality of the bump pads 21 on the same substrate (the first semiconductor element 10 in this case) by changing the resist patterning applied to the $SiO_2$ layer 12 in step Si and the resist patterning applied to the SiN layer 16 in step S5 of the above-mentioned manufacturing processes.

In contrast, the diameter of the Sn-based micro-solder bump 24 of the second semi-conductor element is changed so as to correspond to the diameter of the corresponding bump pad 21.

<Change in Capacity of Bump With Respect to Change in Diameter of Each of Bump Pad 21 and Micro-Bump 24>

Figure 12:
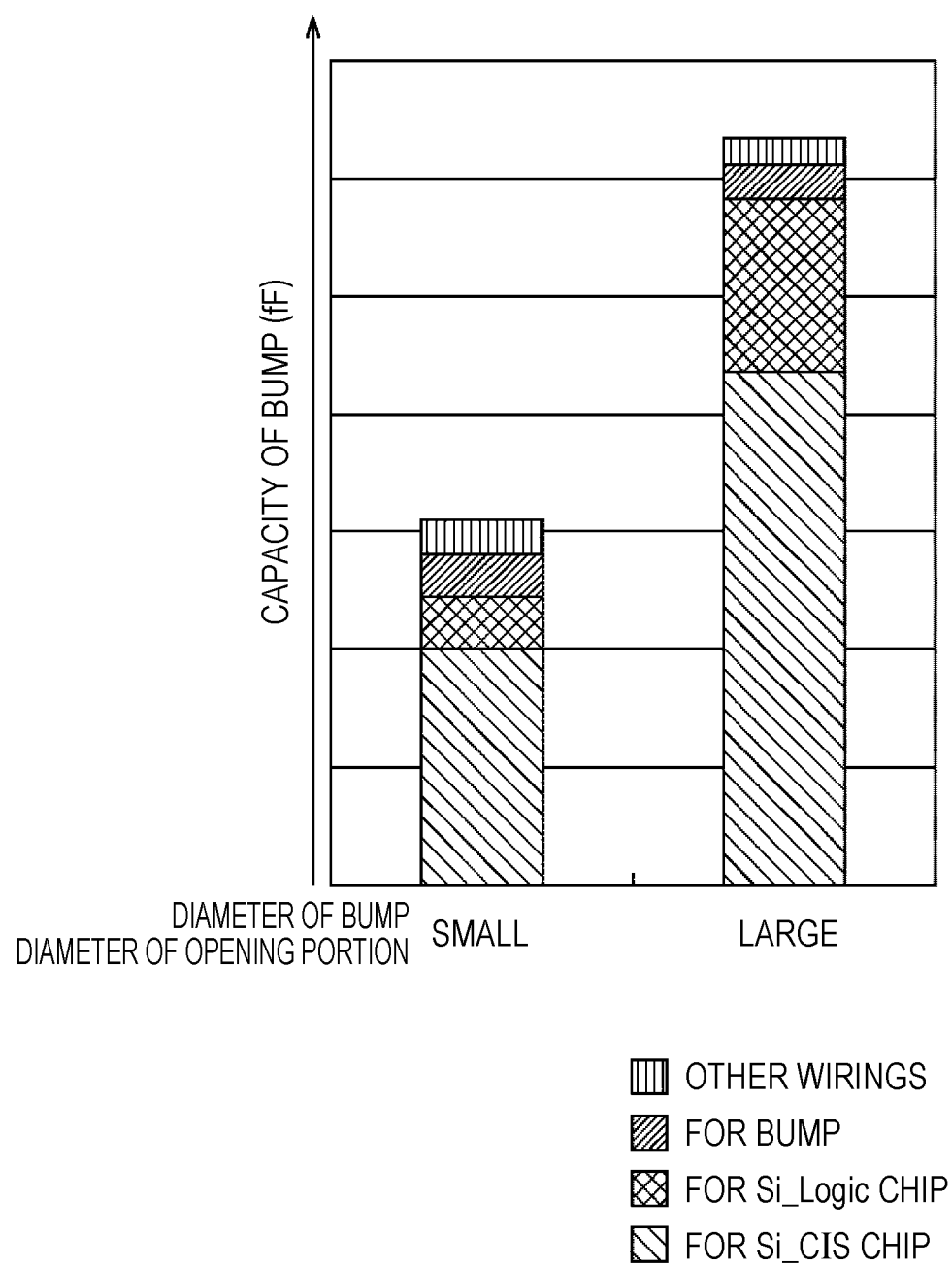
FIG. 12 is a graph illustrating a relationship between the capacity of a bump and the diameter of each of a bump pad and a micro-bump.

FIG. 12 is a graph illustrating change in the capacity of a bump with respect to change in the diameter of each of the bump pad 21 (the opening portion) and the micro-bump.

As illustrated in FIG. 12, the capacity of a bump is small when the diameter of each of the bump pad 21 and the micro-bump 24 is small compared to when the diameter of each of the bump pad 21 and the micro-bump 24 is large. Accordingly, when the connection of a signal line is established via the bump pad 21 having a small diameter and the micro-bump 24 having a small diameter, it is possible to anticipate improvement in the signal characteristics of electric communication signals. In addition, it is possible to easily perform routing at this time.

<Change in Resistance Value With Respect to Change in Diameter of Each of Bump Pad 21 and Micro-Bump 24>

Figure 13:
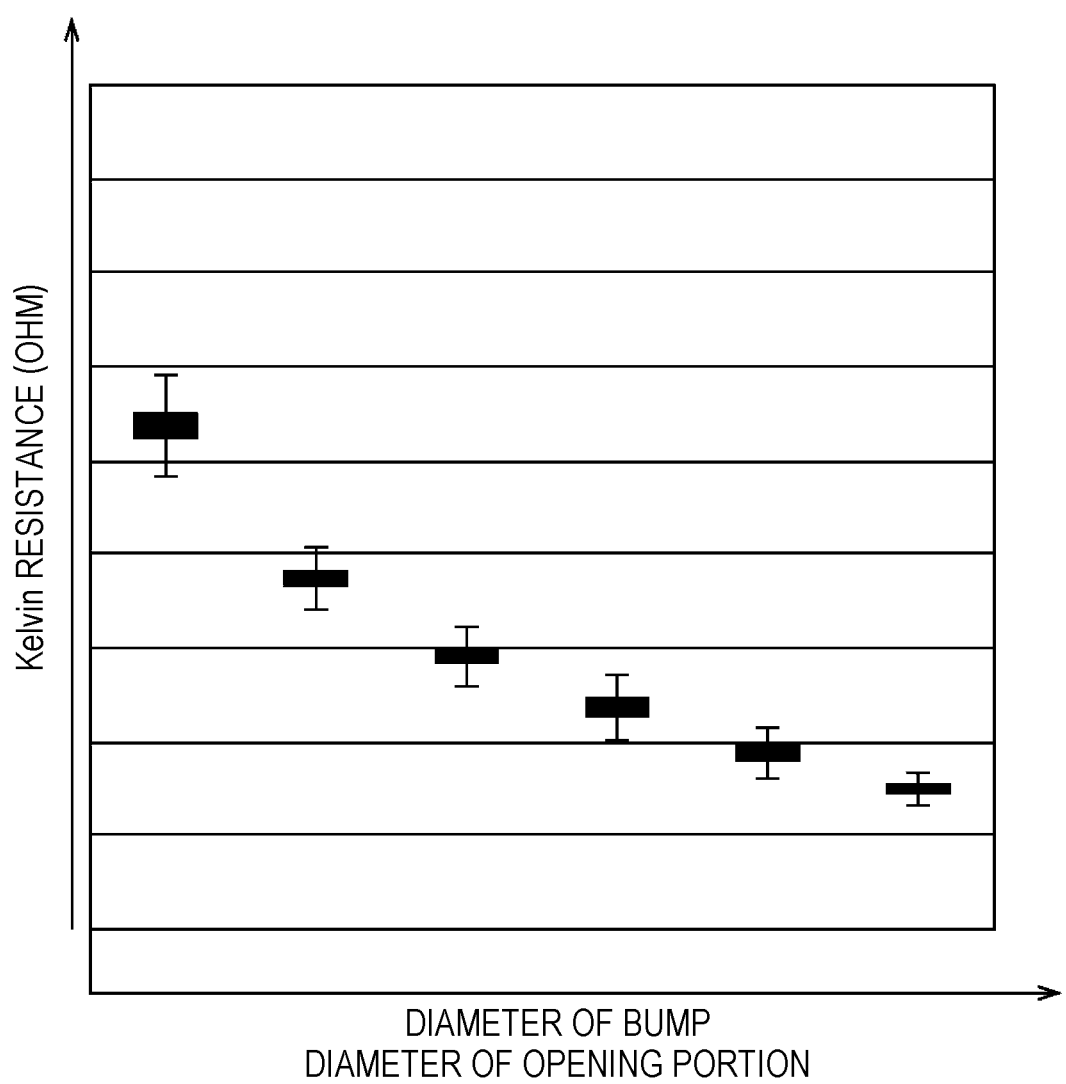
FIG. 13 is a graph illustrating a relationship between a resistance value and the diameter of each of the bump pad and the micro-bump.

FIG. 13 is a graph illustrating change in resistance value with respect to change in the diameter of each of the bump pad 21 (the opening portion) and the micro-bump 24.

As illustrated in FIG. 13, a resistance value decreases further as the diameter of each of the bump pad 21 and the micro-bump 24 increases further. Accordingly, when the connection of a signal line is established via the bump pad 21 having a large diameter and the micro-bump 24 having a large diameter, it is possible to prevent an occurrence of a power supply-related defect such as IR drop.

<Application Example of Second Modification Example of Semiconductor Device>

Figure 14:
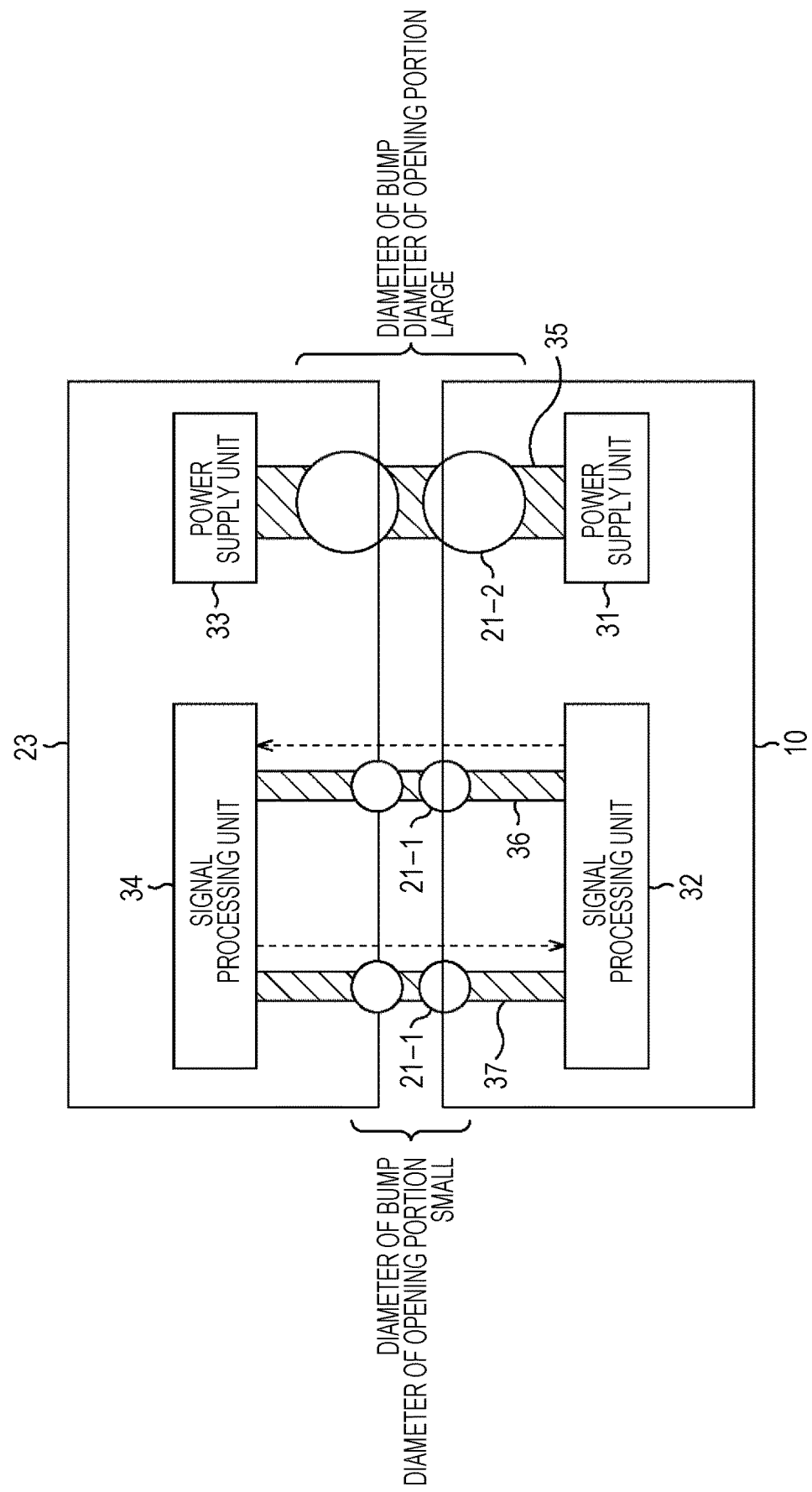
FIG. 14 is a block diagram illustrating an application example of the second modification example of the semiconductor device.

Subsequently, FIG. 14 illustrates an application example of the second configuration example illustrated in FIG. 11.

In this application example, a power supply line 35 connects a power supply unit 31 of the first semiconductor element 10, and a power supply unit 33 of the second semi-conductor element 23, and the connection of the power supply line 35 is established via the bump pad 21-2 having a large diameter and the micro-bump 24 having a large diameter. Signal lines 36 and 37 connect a signal processing unit 32 of the first semi-conductor element 10, and a signal processing unit 34 of the second semiconductor element 23, and the connection of each of the signal lines 36 and 37 is established via the bump pad 21-1 having a small diameter and the micro-bump 24 having a small diameter.

With the configuration of the application example illustrated in FIG. 14, it is possible to improve the signal characteristics of electric communication signals between the first semiconductor element 10 and the second semiconductor element 23, and it is possible to prevent an occurrence of a power supply-related defect such as IR drop.

<Application Example of Semiconductor Device>

Subsequently, a configuration example in which the semiconductor device of the present disclosure is applied to a stacked CMOS image sensor (hereinafter, referred to as a stacked CIS) will be described.

Figure 15:
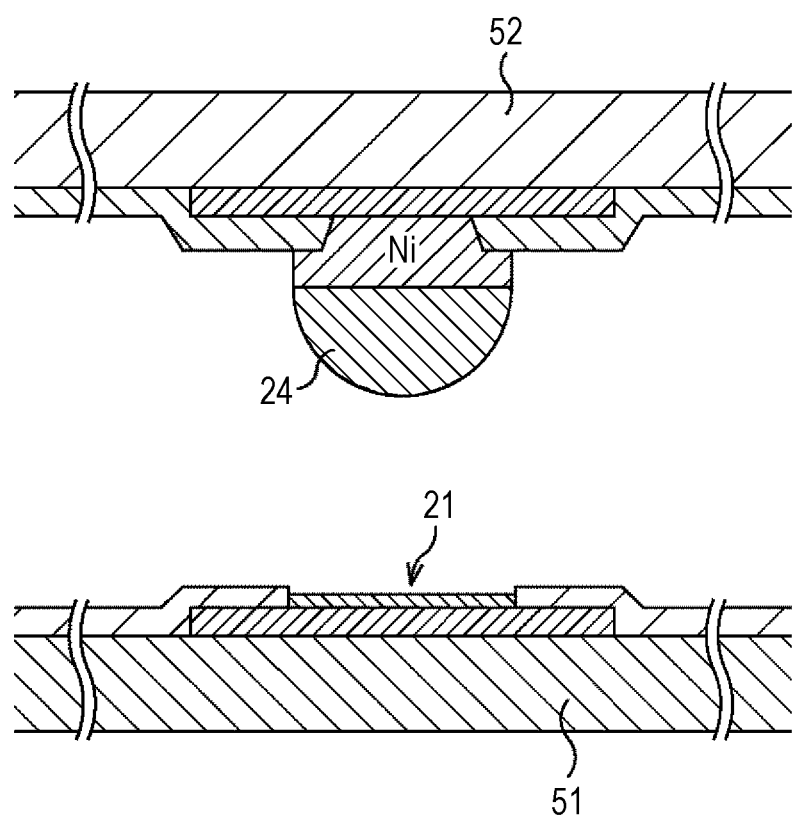
FIG. 15 is a cross-sectional view illustrating a state before the semiconductor devices of the present disclosure are stacked on each other when being applied to a stacked CMOS image sensor.
Figure 16:
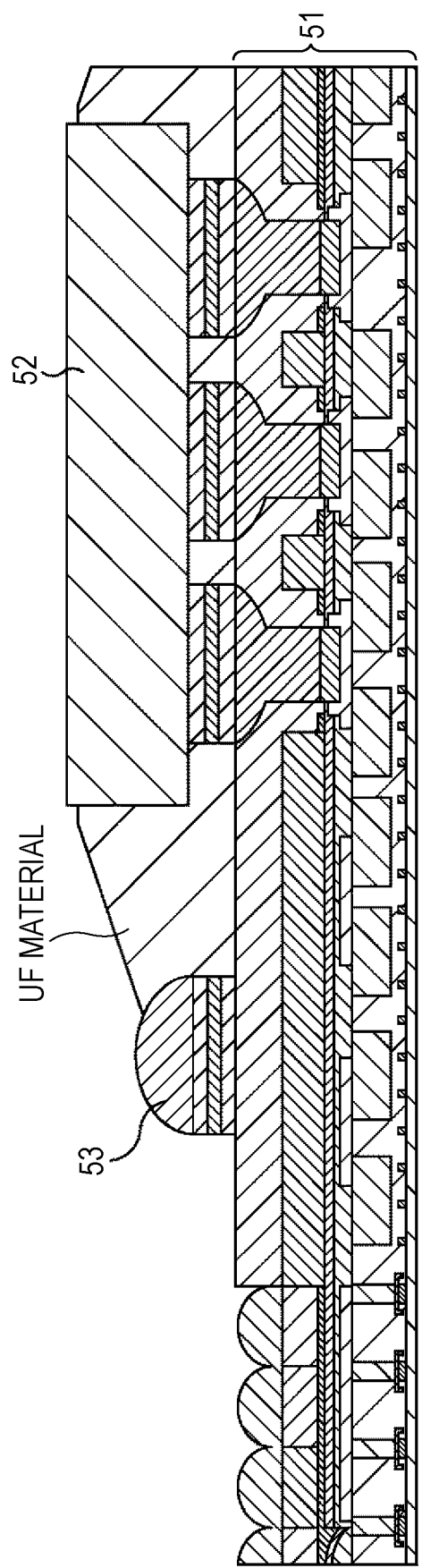
FIG. 16 is a cross-sectional view illustrating a state after the semiconductor devices of the present disclosure are stacked on each other when being applied to the stacked CMOS image sensor.

FIG. 15 illustrates a state before the semiconductor devices of the present disclosure are stacked on each other when being applied to a stacked CIS, and FIG. 16 illustrates a state after the semiconductors are stacked on each other.

That is, in the configuration of the stacked CIS, a logic chip 52 for processing pixel signals output from a pixel substrate 51 is stacked, via chip on wafer (CoW) connection, on the pixel substrate 51 that is provided with a pixel unit for performing photoelectric conversion.

The pixel substrate 51 is equivalent to the first semiconductor element 10, and the bump pad 21 connected to the micro-bump 24 of the logic chip 52 is formed on a surface of the pixel substrate 51, light being incident on the surface. In contrast, the logic chip 52 is equivalent to the second semiconductor element 23, and the micro-bump 24 is formed on a surface of the logic chip 52, the surface being connected to the pixel substrate 51.

Figure 17:
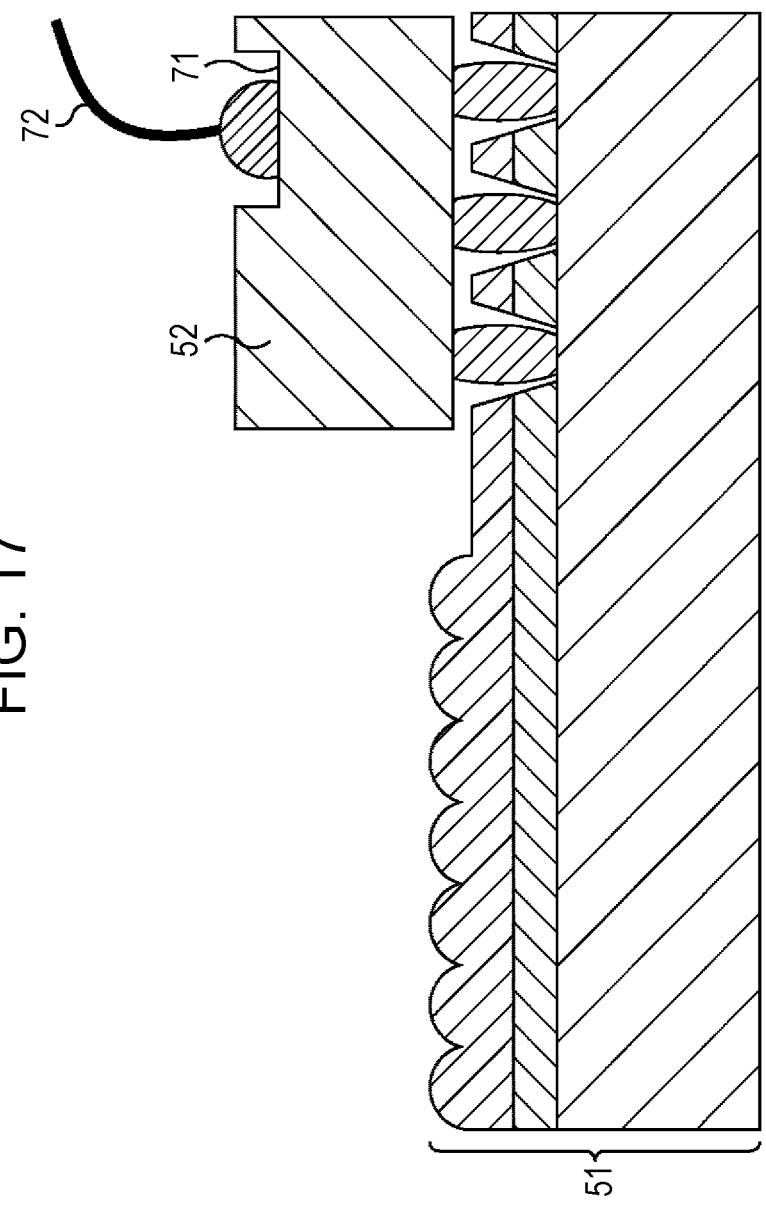
FIG. 17 is a cross-sectional view illustrating a state in which an I/O is connected to a WB pad formed on a logic chip.

The pixel substrate 51 and the logic chip 52 are subjected to a heating treatment while the bump pad 21 and the micro-bump 24 are stacked on each other in such a manner so as to be in contact with each other, and thereby the pixel substrate 51 and the logic chip 52 are electrically connected to each other. As illustrated in FIG. 17, a WB pad 71 is formed on the other surface on the opposite side of the surface of the logic chip 52, the surface being connected to the pixel substrate 51, and an I/O 72 is connected to the WB pad 71.

As illustrated in FIG. 17, since the semiconductor device of the present disclosure is applied to the stacked CMOS image sensor, it is possible to prevent an occurrence of damage such as dust contamination of the pixel unit, which may occur when a micro-pad is also formed on the pixel substrate 51. In addition, it is possible to realize a low stacking height when stacking the logic chip 52 and the pixel substrate 51 on each other, and it is possible to prevent variations in the cleaning of CF.

<Modification Example Relative to Formation of Bump Pad>

Subsequently, a modification example relative to the formation of the bump pad will be described.

Figure 18:
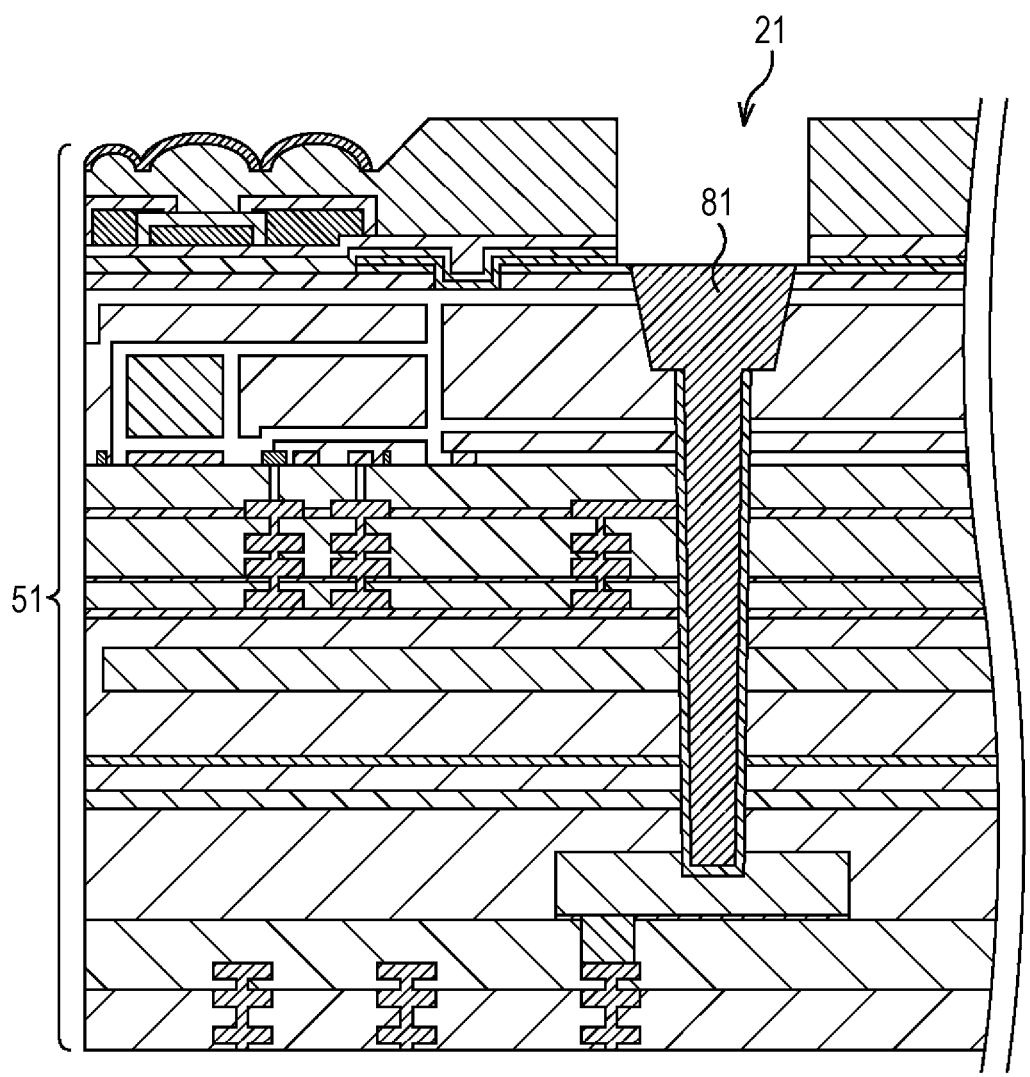
FIG. 18 is a cross-sectional view illustrating a modification example relative to the formation of the bump pad.

In the modification example illustrated in FIG. 18, when a through-electrode 81 is formed in the pixel substrate 51, the opening portion 21 is provided at the position of the through-electrode 81, and a through-electrode 81 is used as the bump pad corresponding to the micro-bump 24 of the logic chip 52. Since the through-electrode 81 is used as the bump pad, it is possible to omit the formation of the first metal layer 13 to the third metal layer 15.

Figure 19:
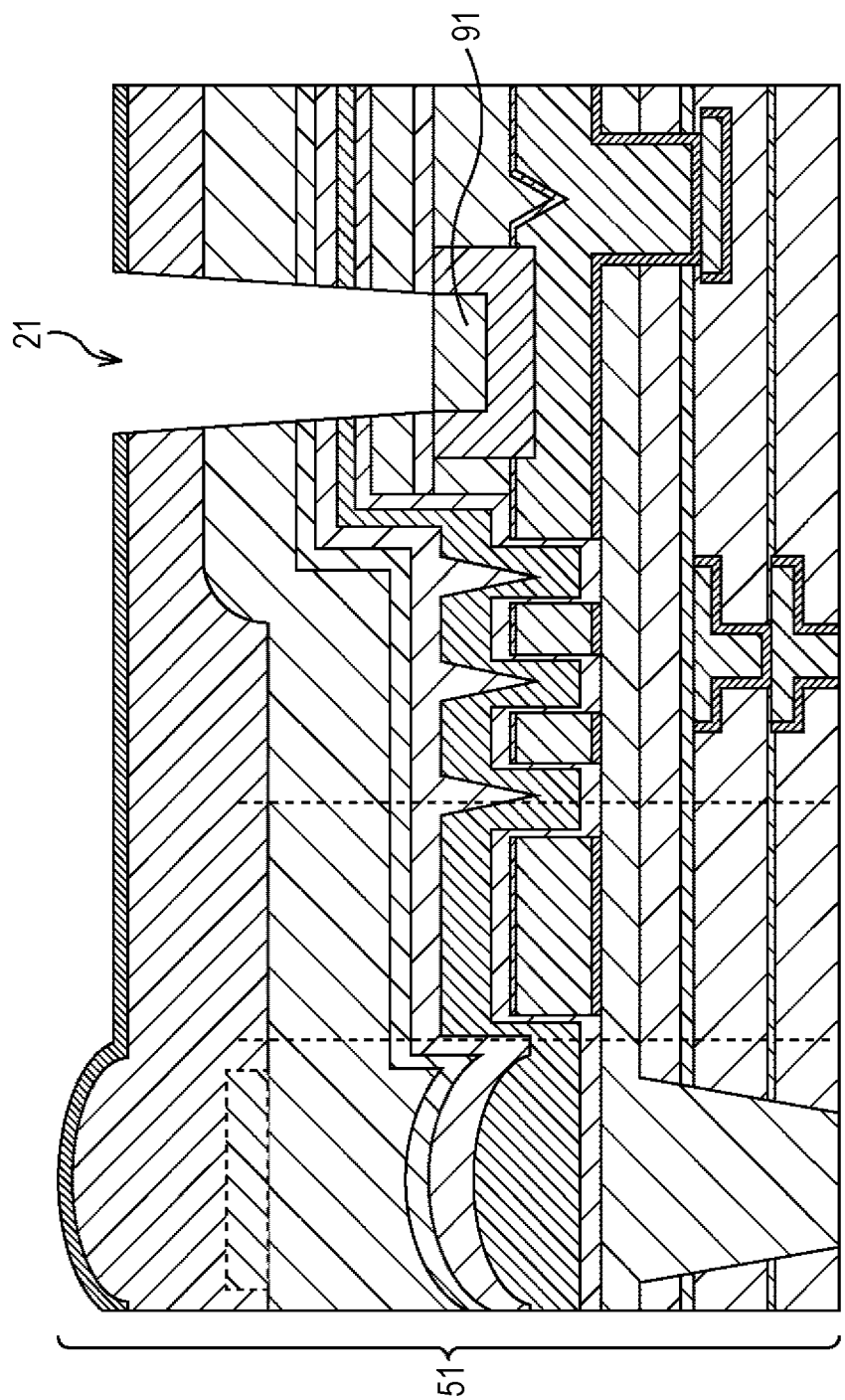
FIG. 19 is a cross-sectional view illustrating a modification example relative to the formation of the bump pad.
Figure 20:
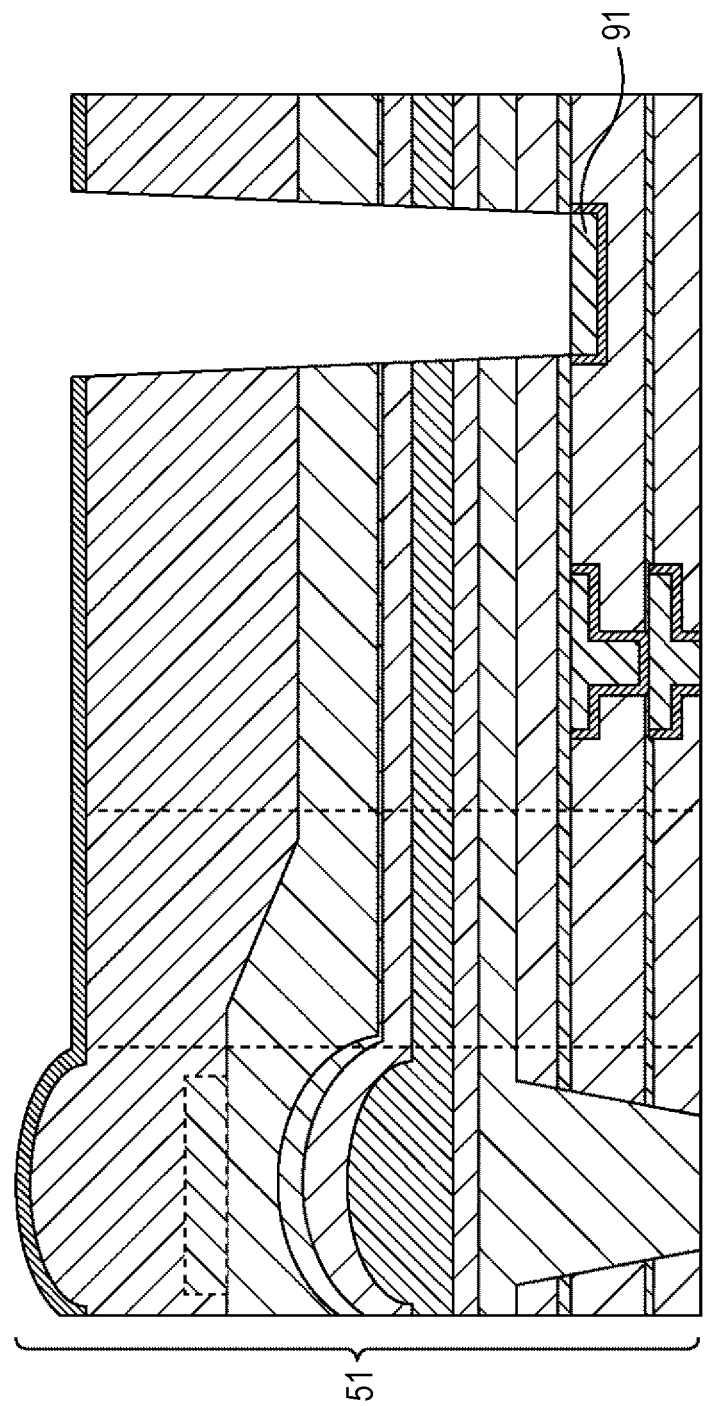
FIG. 20 is a cross-sectional view illustrating a modification example relative to the formation of the bump pad.

In each of modification examples illustrated in FIGS. 19 and 20, the pixel substrate 51 (the first semiconductor element 10) and the Al PAD 11 are omitted, the opening portion 21 is formed to reach a metal wiring (Cu wiring) 91 in the pixel substrate 51, and the metal wiring 91 in the pixel substrate is used as the bump pad corresponding to the micro-bump 24 of the logic chip 52.

Since the Al PAD 11 is omitted, and the metal wiring 91 in the pixel substrate 51 is used as the bump pad, it is possible to obtain less variations of cleaning in a custom process, and it is possible to achieve chip shrink. In addition, it is possible to realize a low stacking height of the logic chip 52.

The semiconductor device of the present disclosure can be applied to various types of electronic devices other than the stacked CIS, in which the respective electrodes of stacked semiconductors are connected to each other.

The present disclosure is not limited to the above-mentioned embodiment, and various modifications can be made to the embodiment insofar as the modifications do not depart from the spirit of the present disclosure.

The present disclosure can have the following configurations.

(1) A semiconductor device which is configured via the stacking of semiconductor elements, and in which the respective electrodes of the opposite semiconductor elements are electrically connected to each other, in which a Sn-based micro-solder bump is formed on an electrode of a second semiconductor element that is one of the opposite semiconductor elements, and in which a concave bump pad opposite to the micro-bump is formed on an electrode of a first semiconductor element that is the other of the opposite semiconductor elements, the electrode being connected to the electrode of the second semiconductor element via the micro-bump.

(2) In the semiconductor device disclosed in (1), a third metal layer diffused to the micro-bump and close to the micro-bump, and a second metal layer made of a metal of the vanadium group are sequentially formed on the bump pad.

(3) In the semiconductor device disclosed in (1) or (2), the first semiconductor element has a plurality of bump pads thereon, the diameters of which are different from each other.

(4) In the semiconductor device disclosed in any one of (1) to (3), the diameters of the bump pads are different depending on the use of the respective electrodes connected thereto.

(5) In the semiconductor device disclosed in any one of (1) to (4), the diameter of the micro-bump of the second semiconductor element corresponds to that of the bump pad of the corresponding first semiconductor element.

(6) In the semiconductor device disclosed in any one of (1) to (5), the third metal layer close to the micro-bump, the second metal layer, and a first metal layer are sequentially formed on the bump pad, the first metal layer being formed of a nitride film of the metal of the vanadium group used in the second metal layer.

(7) In the semiconductor device disclosed in any one of (1) to (6), the second metal layer has an average thickness of 30 nanometers or greater.

(8) In the semiconductor device disclosed in any one of (1) to (6), the first metal layer has an average thickness of 10 nanometers or greater.

(9) In the semiconductor device disclosed in any one of (1) to (6), the second metal layer is made of Ta, and the first metal layer is made of TaN.

(10) In the semiconductor device disclosed in any one of (1) to (6), the third metal layer is made of Cu, Co, Ni, Pd, Au, or Pt.

(11) In the semiconductor device disclosed in (1), the bump pad is formed by an opening portion that is provided from the surface of the first semiconductor element to a through-electrode in the first semiconductor element.

(12) In the semiconductor device disclosed in (1), the bump pad is formed by an opening portion that is provided from the surface of the first semiconductor element to a metal wiring in the first semiconductor element.

(13) In the semiconductor device disclosed in (1), the semiconductor device is a stacked CMOS image sensor in which a logic chip equivalent to the second semi-conductor element is CoW-connected to a pixel substrate equivalent to the first semi-conductor element.

(14) A manufacturing method by which a manufacturing apparatus manufactures a semiconductor device which is configured via the stacking of semiconductor elements and in which the respective electrodes of the opposite semiconductor elements are electrically connected to each other, the method includes a micro-bump formation step of forming a Sn-based micro-solder bump on an electrode of a second semiconductor element that is one of the opposite semiconductor elements, and a bump pad formation step of forming a concave bump pad opposite to the micro-bump on an electrode of a first semiconductor element that is the other of the opposite semiconductor elements, the electrode being connected to the electrode of the second semiconductor element via the micro-bump.

(15) In the manufacturing method disclosed in (14), in the bump pad formation step, a second metal layer made of a metal of the vanadium group is formed on the electrode of the first semiconductor element that is the other of the opposite semiconductor elements, the electrode being connected to the electrode of the second semiconductor element via the micro-bump, and a third metal layer is formed on the second metal layer, which is diffused to the micro-bump, and the micro-bump is brought into contact with the third metal layer, and the micro-bump and the third metal layer are subjected to a heating treatment associated with a reducing atmosphere, and thereby the third metal layer and an oxide film on the surface of the micro-bump are reduced, and due to the diffusion of the third metal layer to the micro-bump, the micro-bump and the second metal layer are brought into contact with each other, and the respective electrodes of the first semiconductor element and the second semiconductor element are electrically connected to each other.

(16) In the manufacturing method disclosed in (15), in the bump pad formation step, a passivation layer is formed on the third metal layer of the first semiconductor element, and an opening portion is provided via the etching of the passivation layer in order for the third metal layer to be exposed.

(17) In the manufacturing method disclosed in (15), in the bump pad formation step, before the second metal layer is formed, a first metal layer is formed on the electrode of the first semiconductor element that is the other of the opposite semiconductor elements, the electrode being connected to the second semiconductor element via the micro-bump, and the first metal layer is formed of a nitride film of the metal of the vanadium group used in the second metal layer.

(18) In the manufacturing method disclosed in (14), in the bump pad formation step, the bump pad is formed by providing an opening portion from a surface of the first semiconductor element to a through-electrode in the first semiconductor element.

(19) In the manufacturing method disclosed in (14), in the bump pad formation step, the bump pad is formed by providing an opening portion from a surface of the first semiconductor element to a metal wiring in the first semi-conductor element.

(20) A semiconductor device, including: a first semiconductor element having a first electrode; a second semiconductor element having a second electrode; a Sn-based micro-solder bump formed on the second electrode; and a concave bump pad on the first electrode opposite to the micro-solder bump, where the first electrode is connected to the second electrode via the micro-solder bump and the concave bump pad.

(21) The semiconductor device according to (20), further including a second metal layer and a third metal layer that are sequentially formed on the concave bump pad, where the third metal layer is diffused to the micro-solder bump, and where the second metal layer is made of a metal of the vanadium group.

(22) The semiconductor device according to any one of (20) to (21), where the first semiconductor element has a plurality of concave bump pads thereon, the diameters of which are different from each other.

(23) The semiconductor device according to any one of (20) to (22), where the diameters of the concave bump pads differ depending on the use of the respective electrodes connected thereto.

(24) The semiconductor device according to any one of (20) to (23), where a diameter of the micro-solder bump corresponds to a diameter of the concave bump pad.

(25) The semiconductor device according to any one of (20) to (21), further including a first metal layer that is sequentially formed on the concave bump pad together with the second metal layer and the third metal layer, where the third metal layer is closest to the micro-solder bump, and where the first metal layer is a nitride film of the metal of the vanadium group used in the second metal layer.

(26) The semiconductor device according to any one of (20) to (25), where the second metal layer has an average thickness of 30 nanometers or greater.

(27) The semiconductor device according to any one of (20) to (26), where the first metal layer has an average thickness of 10 nanometers or greater.

(28) The semiconductor device according to any one of (20) to (27), where the second metal layer is Ta, and the first metal layer is TaN.

(29) The semiconductor device according to any one of (20) to (28), where the third metal layer is one of Cu, Co, Ni, Pd, Au, and Pt.

(30) The semiconductor device according to any one of (20) to (29), where the first electrode is a through-electrode.

(31) The semiconductor device according to any one of (20) to (30), further including: an opening portion that extends from a surface of the first semiconductor element to a metal wiring in the first semiconductor element, where the opening portion forms the concave bump pad.

(32) The semiconductor device according to any one of (20) to (31), where the semi-conductor device is a stacked CMOS image sensor including a logic chip equivalent to the second semiconductor element that is CoW-connected to a pixel substrate equivalent to the first semiconductor element.

(33) A method of manufacturing a semiconductor device that includes a first semi-conductor element having a first electrode stacked with a second semiconductor element having a second electrode, the method including: forming a Sn-based micro-solder bump on the second electrode; and forming a concave bump pad on the first electrode opposite to the micro-solder bump, where the first electrode is connected to the second electrode via the micro-solder bump and the concave bump pad.

(34) The manufacturing method according to (33), where during the forming of the concave bump pad, a second metal layer made of a metal of the vanadium group is formed on the first electrode and a third metal layer is formed on the second metal layer, where the third metal layer is diffused to the micro-solder bump, and the micro-solder bump and the third metal layer are subjected to a heating treatment with a reducing atmosphere, and thereby the third metal layer and an oxide film on the surface of the micro-solder bump are reduced, and due to the diffusion of the third metal layer to the micro-solder bump, the micro-solder bump and the second metal layer are brought into contact with each other, and the first and second electrodes are electrically connected to each other.

(35) The manufacturing method according to any one of (33) to (34), where during the forming of the concave bump pad, a passivation layer is formed on the third metal layer of the first semiconductor element, and an opening portion is formed via etching of the passivation layer to expose the third metal layer.

(36) The manufacturing method according to any one of (33) to (35), where during the forming of the concave bump pad, before the second metal layer is formed, a first metal layer is formed on the first electrode, and where the first electrode is connected to the second semiconductor element via the micro-solder bump, and the first metal layer is a nitride film of the metal of the vanadium group used in the second metal layer.

(37) The manufacturing method according to any one of (33) to (36), where the first electrode is a through-electrode.

(38) The manufacturing method according to any one of (33) to (37), where during the forming of the concave bump pad, the concave bump pad is formed by providing an opening portion from a surface of the first semiconductor element to a metal wiring in the first semiconductor element.

(39) The manufacturing method according to any one of (33) to (38), where the semi-conductor device is a stacked CMOS image sensor including a logic chip equivalent to the second semiconductor element and a pixel substrate equivalent to the first semi-conductor element, and where the logic chip and the pixel substrate are subjected to a heat treatment while the concave bump pad and the micro-solder bump are in contact.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

10 First semiconductor element
11 Al PAD
12 SiO$_2$ layer
13 First metal layer
14 Second metal layer
15 Third metal layer
16 SiN layer
21 Opening portion (bump pad)
23 Second semiconductor element
24 Micro-bump
31 Power supply unit
32 Signal processing unit
33 Power supply unit
34 Signal processing unit
35 Power supply line
36, 37 Signal line
51 Pixel substrate
52 Logic chip
81 Through-electrode
91 Cu wiring

The invention claimed is:

1. A semiconductor device comprising:
a first semiconductor element comprising:
a first electrode;
a first metal layer disposed in a first concave shape in contact with and above the first electrode, the first metal layer comprising a nitride film of a vanadium group metal;
a second metal layer disposed in a second concave shape in contact with and above the first metal layer, wherein the second metal layer is made of the vanadium group metal;
a third metal layer disposed in a flat shape in contact with the second metal layer; and
a passivation layer disposed above and in contact with a top-facing side of each of the first metal layer and the second metal layer;
a second semiconductor element; and
a micro-solder bump in contact with the passivation layer, the third metal layer, and the second semiconductor element, wherein the micro-solder bump is disposed directly on the third metal layer, and wherein the third metal layer is exposed through an opening in the passivation layer.

2. The semiconductor device according to claim 1, wherein the second metal layer and the third metal layer are sequentially formed on a concave bump pad, and wherein the third metal layer is diffused to the micro-solder bump.

3. The semiconductor device according to claim 2, wherein the first semiconductor element has a plurality of concave bump pads thereon.

4. The semiconductor device according to claim 3, wherein diameters of each of the concave bump pads differ depending on a usage of an electrode connected thereto.

5. The semiconductor device according to claim 2, wherein a diameter of the micro-solder bump corresponds to a diameter of the concave bump pad.

6. The semiconductor device according to claim 2, wherein the first metal layer is sequentially formed on the concave bump pad together with the second metal layer and the third metal layer, and wherein the third metal layer is closest to the micro-solder bump.

7. The semiconductor device according to claim 6, wherein the second metal layer has an average thickness of 30 nanometers or greater.

8. The semiconductor device according to claim 6, wherein the first metal layer has an average thickness of 10 nanometers or greater.

9. The semiconductor device according to claim 6, wherein the second metal layer is Ta, and the first metal layer is TaN.

10. The semiconductor device according to claim 6, wherein the third metal layer is one of Cu, Co, Ni, Pd, Au, and Pt.

11. The semiconductor device according to claim 1, wherein the first electrode is a through-electrode.

12. The semiconductor device according to claim 1, further comprising: an opening portion that extends from a surface of the first semiconductor element to a metal wiring in the first semiconductor element, wherein the opening portion forms a concave bump pad.

13. The semiconductor device according to claim 1, wherein the semiconductor device is a stacked CMOS image sensor including a logic chip equivalent to the second semiconductor element that is CoW-connected to a pixel substrate equivalent to the first semiconductor element.

14. The semiconductor device according to claim 1, wherein the micro-solder bump comprises Sn.

15. The semiconductor device according to claim 1, wherein the third metal layer is diffused to the micro-solder bump.

16. The semiconductor device according to claim 15, wherein the micro-solder bump is in contact with a side surface of the passivation layer.

17. The semiconductor device according to claim 1, wherein the second metal layer is Ta, and the first metal layer is TaN.

18. The semiconductor device according to claim 1, wherein the second metal layer has an average thickness of 30 nanometers or greater.

19. The semiconductor device according to claim 1, wherein the first metal layer has an average thickness of 10 nanometers or greater.

20. A method of manufacturing a semiconductor device including a first semiconductor element, the first semiconductor element having a first electrode, and a second semiconductor element, the method comprising:
  disposing a first metal layer in a first concave shape in contact with and above the first electrode, the first metal layer comprising a nitride film of a vanadium group metal;
  disposing a second metal layer in a second concave shape in contact with and above the first metal layer, wherein the second metal layer is made of the vanadium group metal;
  disposing a third metal layer in a flat shape in contact with the second metal layer;
  disposing a passivation layer above and in contact with a top-facing side of each of the first and second metal layers; and
  disposing a micro-solder bump on the third metal layer, wherein the micro-solder bump is in contact with the passivation layer, the third metal layer, and the second semiconductor element, and wherein the third metal layer is exposed through an opening in the passivation layer.

21. The method according to claim 20, wherein the first semiconductor element has a plurality of concave bump pads thereon.

22. The method according to claim 20, wherein the second metal layer has an average thickness of 30 nanometers or greater.

23. The method according to claim 20, wherein the first metal layer has an average thickness of 10 nanometers or greater.

24. The method according to claim 20, wherein the second metal layer is Ta, and the first metal layer is TaN.

25. The method according to claim 20, wherein the first electrode is a through-electrode.

26. The method according to claim 20, wherein the semiconductor device comprises an opening portion that extends from a surface of the first semiconductor element to a metal wiring in the first semiconductor element, wherein the opening portion forms a concave bump pad.

* * * * *